(12) United States Patent
Tempel

(10) Patent No.: US 7,349,251 B2
(45) Date of Patent: Mar. 25, 2008

(54) INTEGRATED MEMORY CIRCUIT ARRANGEMENT

(75) Inventor: Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/283,251

(22) Filed: Nov. 17, 2005

(65) Prior Publication Data

US 2006/0067119 A1 Mar. 30, 2006

Related U.S. Application Data

(63) Continuation of application No. PCT/EP2004/050356, filed on Mar. 24, 2004.

(30) Foreign Application Priority Data

May 22, 2003 (DE) .................. 103 23 244

(51) Int. Cl.
 G11C 5/06 (2006.01)
 G11C 11/34 (2006.01)
(52) U.S. Cl. .................. 365/185.05; 365/63
(58) Field of Classification Search ........... 365/185.01, 365/185.16, 189.02, 185.13, 230.03, 185.05, 365/63
See application file for complete search history.

(56) References Cited

U.S. PATENT DOCUMENTS

| 5,280,438 | A | * | 1/1994 | Kanemaru | .................. 377/50 |
|---|---|---|---|---|---|
| 5,428,621 | A | * | 6/1995 | Mehrotra et al. | ........... 714/721 |
| 5,557,124 | A | * | 9/1996 | Roy et al. | .................. 257/316 |
| 5,559,048 | A | | 9/1996 | Inoue | |
| 5,717,636 | A | * | 2/1998 | Dallabora et al. | ...... 365/185.13 |
| 5,789,776 | A | * | 8/1998 | Lancaster et al. | ........... 257/296 |
| 5,994,744 | A | * | 11/1999 | Katayama et al. | .......... 257/370 |
| 6,072,720 | A | * | 6/2000 | Peng et al. | ............. 365/185.05 |
| 6,188,605 | B1 | * | 2/2001 | Nomura et al. | ........ 365/185.11 |
| 6,243,313 | B1 | | 6/2001 | Sakamoto et al. | |
| 6,307,780 | B1 | * | 10/2001 | Tanaka et al. | ......... 365/185.13 |
| 6,438,030 | B1 | | 8/2002 | Hu et al. | |
| 6,480,422 | B1 | | 11/2002 | Wong | |
| 6,567,315 | B2 | | 5/2003 | Takase et al. | |
| 2002/0114192 | A1 | * | 8/2002 | Takase et al. | .......... 365/185.28 |
| 2002/0114208 | A1 | * | 8/2002 | Yamano | ................. 365/230.03 |
| 2002/0141240 | A1 | * | 10/2002 | Satoh et al. | ........... 365/185.15 |
| 2004/0108512 | A1 | * | 6/2004 | Iwata et al. | .................. 257/100 |

* cited by examiner

Primary Examiner—Richard T. Elms
Assistant Examiner—Douglas King
(74) Attorney, Agent, or Firm—Brinks Hofer Gilson & Lione

(57) ABSTRACT

A memory circuit arrangement includes a switching element per column that can be used to connect or disconnect two bit lines for memory cells of a column. The switching element leads to a reduction of the chip area and/or to an improvement in the electronic properties of the memory circuit arrangement.

18 Claims, 3 Drawing Sheets

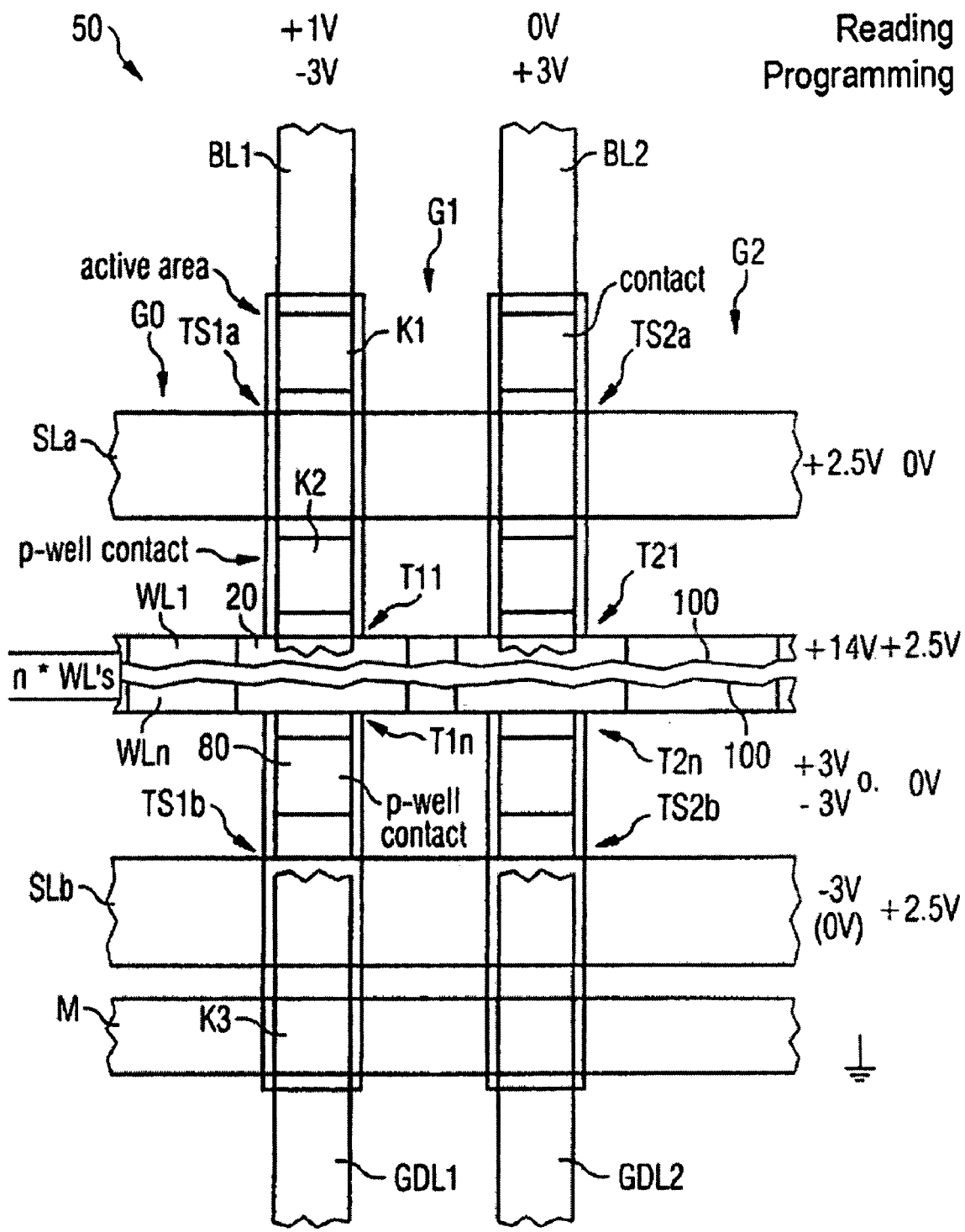

INTEGRATED MEMORY CIRCUIT ARRANGEMENT

PRIORITY AND CROSS REFERENCE TO RELATED APPLICATION

This application is a continuation of International Application No. PCT/EP2004/050356 filed Mar. 24, 2004, which claims priority to German application 103 23 244.3, filed May 22, 2003, both of which are incorporated in their entirety by reference herein.

BACKGROUND OF THE INVENTION

1. Field of the Invention

The invention relates to a memory circuit arrangement, and in particularly to a memory arrangement having a switching element for connection of bit lines for memory cells.

2. Description of the Related Art

Memory cells of a memory circuit are arranged in rows and columns or in matrix-type fashion. Each memory cell has a transistor that may have a floating gate. Word lines and bit lines are transversely arranged where the word lines are electrically connected to control electrodes (also referred to as the gate) of the transistors of a row. The bit lines are connected to terminal electrodes of the transistors of a column. The terminal electrodes are formed, for example, by doped regions in a substrate, and may be referred to as a drain and a source for field effect transistors.

The memory cells may store content in such a way that the content is erased when an operating voltage is switched off. Alternatively, the memory cells may retain their content when the operating voltage is switched off. In this context, reference is made to memory cells that effect volatile storage and memory cells that effect nonvolatile storage, respectively.

Each column of memory cells is connected to two bit lines, namely to a drain line and a source line. The source line is utilized for memory cells of two adjacent columns. The floating gate transistor has a floating gate, or memory gate, that is an electrode insulated on all sides. Insofar as the term column is used hereinafter, it designates—unless differentiated more precisely—the memory cells of a column of the entire memory arrangement. The memory cells have high power consumption and may assume a large chip area. The memory arrangements may also have a complex architectures where two metallic bit lines, namely a metallic source line and a metallic bit line, are in each case required per column.

Accordingly, there is a need to provide a memory circuit of simple construction having improved electronic properties and which uses a small chip area and low power consumption. It is desirable for the memory circuit arrangement to make it possible to maintain previous potential conditions or to utilize other potential conditions for different operating modes.

SUMMARY OF THE INVENTION

The present invention relates to a memory circuit arrangement having multiple memory cells arranged in rows and columns in a matrix-type fashion where each memory cell has at least one transistor, such as a floating gate transistor. Word lines are electrically conductively connected to control electrodes, or the gate, of the transistors of memory cells of a row of the matrix and bit lines are connected to terminal electrodes of the transistors of memory cells of a column of the matrix. The memory cell may be configured to provide volatile storage or nonvolatile storage.

In one aspect, the memory circuit arrangement includes, per column of memory cells, at least one switching element that enables the connection and disconnection of an electrically conductive connection of two bit lines of the same column of the matrix. In a first operating mode of the circuit arrangement, the two bit lines carry the same potential and are electrically conductively connected with the aid of the switching element. In second operating mode of the circuit arrangement, different potentials may be present on the two bit lines, and the bit lines are disconnected from one another with the aid of the switching element. In the first operating mode, the potential of one bit line can thus also be applied to the other bit line by means of a simple circuitry measure. A potential that is present on the connected bit line in other operating modes is then turned off, for example for all the memory cells of the circuit arrangement or for a portion of the memory cells of the circuit arrangement. By way of example, the potential is turned off for all the memory cells of the memory or for only for the memory cells of a memory segment in which the affected column is situated. In both cases, a transistor can be used for disconnection.

The switching element provides degrees of freedom that permit new operating modes of the memory circuit arrangement. By way of example, it is possible to carry the same potential on the disconnected voltage feed in a plurality or even in all of the operating modes. The switching power required for changing the potential becomes lower.

In an embodiment, one bit line that is electrically conductively connected to the switching element is arranged in a doped region of a substrate, such as a silicon substrate. By contrast, the other bit line which is electrically conductively connected to the switching element is a bit line of metal layer or is a bit line having metal. The doped region is arranged, for example, between two isolation trenches for isolating the memory cells of mutually adjacent columns. As an alternative, the doped region can be arranged in such an isolation trench. The metal line has a smaller resistance in comparison with a doped region, so that leading the operating voltage as far as the switching element is associated with a comparatively small voltage drop and power loss. It is only at the switching element that the doped region is connected in. If the length of the doped region is adapted to the conductivity thereof, then voltage drops or losses with regard to the writing, reading or erasing times are acceptable in comparison with the exclusive connection of bit lines made of metal. If a bit line comprises metal, then the disadvantages associated with the use of doped regions with regard to the specific conductivity and a voltage drop associated therewith do not occur at least with regard to these bit lines. Moreover, what can be achieved by using a plurality of switching elements per column or by skillful arrangement of the switching element or of the switching elements, for example on half the length of the two bit lines, is that the disadvantages associated with the doped region do not substantially impair the operation of the circuit arrangement.

In a next embodiment, the bit lines are local bit lines that can be electrically conductively connected to global bit lines via further switching elements. The local bit lines define a memory segment by virtue of the fact that they are connected only to a portion of the cells of a column of the memory circuit arrangement. The circuit arrangement contains at least two memory segments. The use of memory segments affords the possibility of driving the memory circuit arrangement in a similar manner to a magnetic storage disk that likewise contains segments. Moreover, what is achieved by the use of local and global bit lines is that the global bit lines can be arranged in upper metallization layers and, by way of example, have a larger cross-section than the local bit lines or the distance with respect to one another is increased. The former reduces the bit line resistance (R) and the latter reduces the capacitive load (C) of the bit lines. As a result, the RC delay due to the global bit lines is shorter and the access times of the circuit arrangement are improved. The use of memory segments additionally affords the simple possibility of limiting the length of the local bit lines, in particular of the local bit lines routed in doped regions.

In another embodiment, the number of global bit lines in the circuit arrangement is half as large as the number of metallic local bit lines. If source lines in different columns of a memory segment have to carry potentials that are different from one another in one operating mode and if drain lines have to carry potentials that are different from one another in one operating mode, without the use of the switching elements, more global bit lines than in accordance with the development are necessary even in the case of double utilization of global lines for two local lines.

In another embodiment, the switching element is arranged at an end of a row of memory cells of a column of a memory segment. Alternatively or in addition, the switching element is arranged between the memory cells of a column of a memory segment, preferably in the center of the column, in order to feed a current into two equal length sections of the bit lines arranged in a doped region. The voltage drop across the bit line in the doped region can thus be reduced further in a simple way.

In a second aspect, the invention relates to a memory circuit arrangement having at least one further switching element per column that enables the production and the disconnection of an electrically conductive connection of a collective line running in the row direction to a respective bit line. The development is based on the consideration that a local production and disconnection of the connection to the collective line is associated with a low power demand in comparison with a segment-related or global production and disconnection of a connection to the collective line. Moreover, operating modes are possible with potential conditions which would require additional lines in the column direction without the invention according to the second aspect.

In particular, a combination of the two circuit arrangements according to the invention leads to a circuit arrangement of simple construction which has particularly good electrical properties, for example, with regard to the power consumption. Moreover, operating modes are again made possible with potential conditions which would require additional lines in the column direction without the combination. Furthermore, the required chip area is small on account of the combination.

In one embodiment, the circuit arrangement contains a control unit, which drives the switching elements for connecting two bit lines alternately to the switching elements for connecting the collective line to the bit line. The alternate driving ensures that no potential conflicts occur on a bit line.

In another embodiment, for a column, the switching element for connecting the two bit lines is adjacent to the switching element for connecting a bit line to the collective line. As an alternative, the two switching elements are arranged at different locations, in particular at different ends of the column.

In a next embodiment the circuit arrangement contains a drive circuit constructed in such a way that a memory cell transistor is programmed and/or erased with a uniform channel (UCP Uniform Channel Programming), so that the tunnel oxide is stressed uniformly. The advantages obtained by means of the switching elements are particularly great in particular with this type of programming.

In another embodiment, the bit lines of a column of memory cells are arranged such that they overlap one another in the direction normal to a substrate main area. In this case, a substrate main area is an area having an area content with respect to other areas, e.g. with respect to edge areas, that is greater than the area content of these areas. That is, the bit lines are arranged such that the two bit lines lie one above the other if the substrate main area lies in the horizontal.

DESCRIPTION OF THE DRAWINGS

Exemplary embodiments of the invention are explained below with reference to the accompanying drawings.

FIG. 4 illustrates the layout of a memory circuit.

DESCRIPTION OF THE PREFERRED EMBODIMENTS

Identical, functionally identical, or similar elements and signals are referred to with the same reference symbols in the figures unless stated otherwise.

Figure 1:
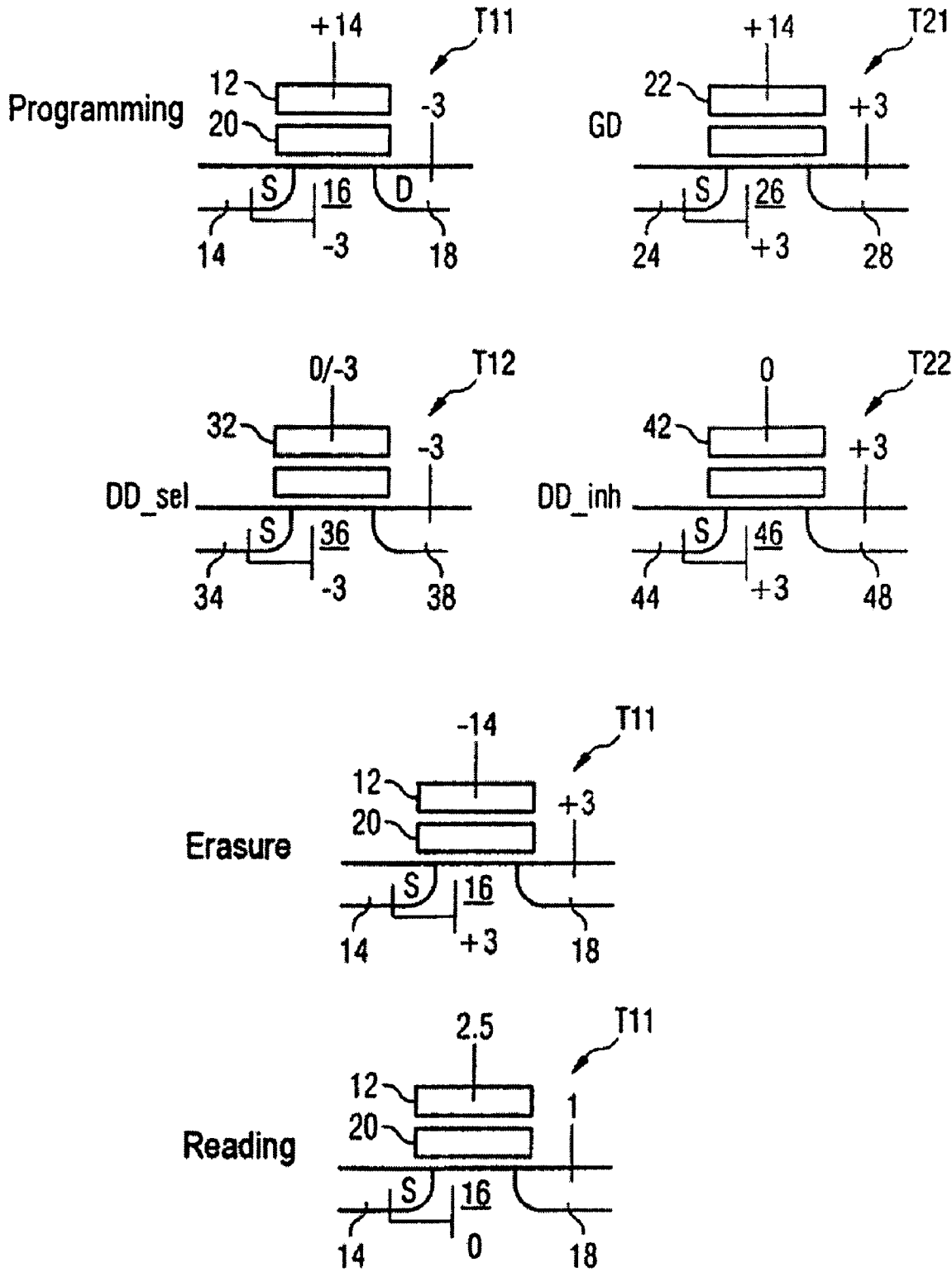
FIG. 1 illustrates voltage conditions at memory cells during programming, erasing and reading.

FIG. 1 shows an exemplary embodiment of voltage conditions at memory cells during programming, during erasing and during reading of memory cells of a circuit arrangement explained in greater detail below with reference to FIGS. 2 to 4. The voltage values cited in connection with FIG. 1 are only examples and may be chosen deviating within wide limits from the voltage values cited, e.g. deviating by plus or minus 50% or 30% of the respective voltage value. Operating modes with fundamentally different voltage values can also be realized. In the explanation of FIG. 1, reference is made to memory transistors T11 to T22, the arrangement of which in a memory cell array is explained in more detail below with reference to FIG. 2. The memory transistor T11 is chosen by way of example for explaining the operating modes. It goes without saying that further transistors can be written to, erased or read in the same way.

During programming, as illustrated in FIG. 1, a voltage of +14 Volts is applied to a gate electrode 12 of the memory transistor T11. During programming a voltage of −3 Volts in each case is present at a source region 14, a drain region 18 and at a substrate region 16 of the memory transistor T11. On account of these voltage conditions, a tunneling current flows from an inversion channel in the substrate 16 over the whole area through a tunnel oxide into the all-around insulated electrode 20 of the transistor T11.

During programming, the following voltages are present at transistors in the same row as the memory transistor T11 but in a different column, e.g. at the transistor T21:
+14 Volts at a gate electrode 22,
+3 Volts at a source region 24 and at a substrate region 26, and
+3 Volts at a drain region 28 of the transistor T21.

The following potentials are present at transistors in the same column as the transistor T11 but in a different row of the memory cell array, e.g. at the transistor T12:
   0 Volts or −3 Volts at a gate electrode 32,
   3 Volts at a source region 34 and at a substrate region 36, and
   3 Volts at a source region 38 of the transistor T12.

The following voltages are present at transistors in different rows and in different columns than the transistor T11, e.g. at the transistor T22:
   0 Volts at a gate electrode 42,
   +3 Volts at a source region 44 and at a substrate region 46, and
   +3 Volts at a drain region 48.

During erasure, all the memory transistors of a memory segment are erased simultaneously so that the same potential conditions exist at all the memory transistors T11 to T22. FIG. 1 illustrates the erasure operation for the memory transistor T11 as representative of all the memory transistors T11 to T22. During erasure the following voltages are present at the transistor T11:
   −14 Volts at the gate electrode 12,
   +3 Volts at the source region 14 and at the substrate region 16, and
   +3 Volts at the drain region 18.

The following potentials are present when reading the memory state of the memory transistor T11:
   +2.5 Volts at the gate electrode 12,
   0 Volts at the source region 14 and at the substrate region 16, and
   1 Volt at the drain region 18.

Figure 2:
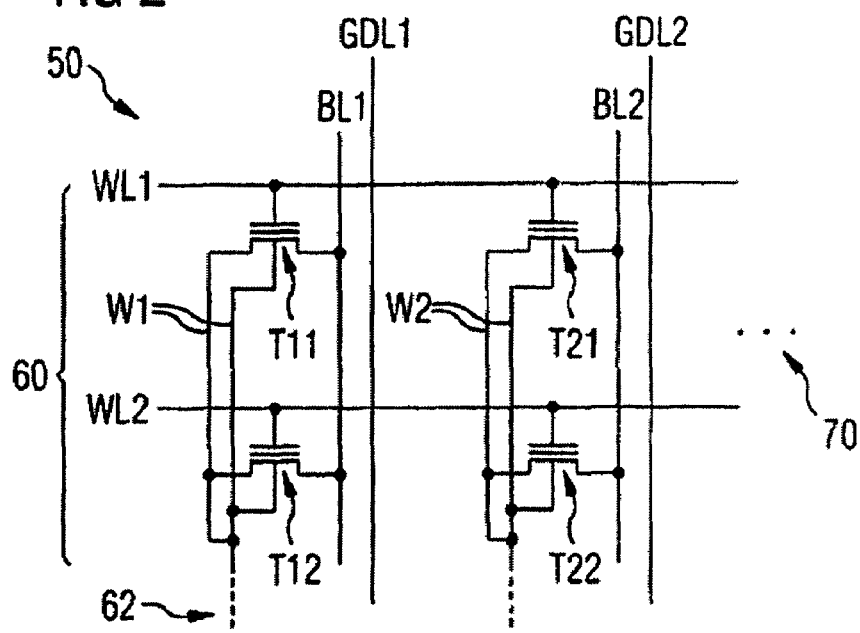
FIG. 2 illustrates a circuit diagram of a memory cell array.

FIG. 2 shows a circuit diagram of a memory circuit 50, which contains, inter alia, a cell array subdivided into a plurality of memory segments 60, 62. The memory segments 60, 62 are constructed substantially identically, so that only the construction of the memory segment 60 is explained below. The memory segment 60 may include multiple memory transistors T11 to Tmn, where m designates the number of columns and n designates the number of rows in a memory segment. Each memory cell of the memory cell array comprises a memory transistor, e.g. the transistor T11. The memory cells of the memory segment are arranged in matrix-type fashion. The gate electrodes of the memory transistors T11, T21 of a row are connected to a word line WL1. The gate electrodes of the memory transistors T12, T22 to T2m are connected to a word line WL2. Likewise, for example a further 14 word lines of the memory segment 60 are in each case connected to the gate electrodes of the memory transistors of a row.

The memory transistors T11 to Tmn of a memory segment 60 are all constructed substantially identically. Therefore, reference is made to the explanations concerning FIG. 1 for the memory transistor T11.

Drain regions of memory transistors of a column of the memory segment 60 are connected to a local bit line, e.g. the drain regions (D) of the memory transistors T11 and T12 are connected to a local bit line BL1. A local bit line BL2 is connected to the drain regions (D) of the transistors of the second column, in particular to the drain regions (D) of the memory transistors T21 and T22. Further memory cells 70 of the memory segment 60 are indicated by dots. By way of example, the memory segment 60 contains 1024 columns.

The source regions (S) and also the substrate regions of the memory transistors of a column are in each case connected via a doped well W1, W2 to Wm. Isolation trenches in each case lie between the wells W1, W2, etc. A well W1, W2 is formed for example by a p-doped layer and an underlying n-doped layer. The contact-connection of the source regions (S) of the memory transistors T11 to T22 to a well W1, W2 is produced for example by means of a siliciding and a contact region doped into the well, see e.g. U.S. Pat. No. 6,438,030 B1, which is incorporated by reference in its entirety herein.

Moreover, global drain lines run via all the memory segments 60, 62 in the column direction, of which two global drain lines GDL1 and GDL2 are illustrated in FIG. 2. In an alternative exemplary embodiment, a global drain line is utilized for two local bit lines of a memory segment 60, 62 with the aid of selection transistors. Selection transistors for connecting the local bit lines BL1 and BL2 to the global drain lines GDL1 and GDL2 are not illustrated in FIG. 2.

Figure 3:
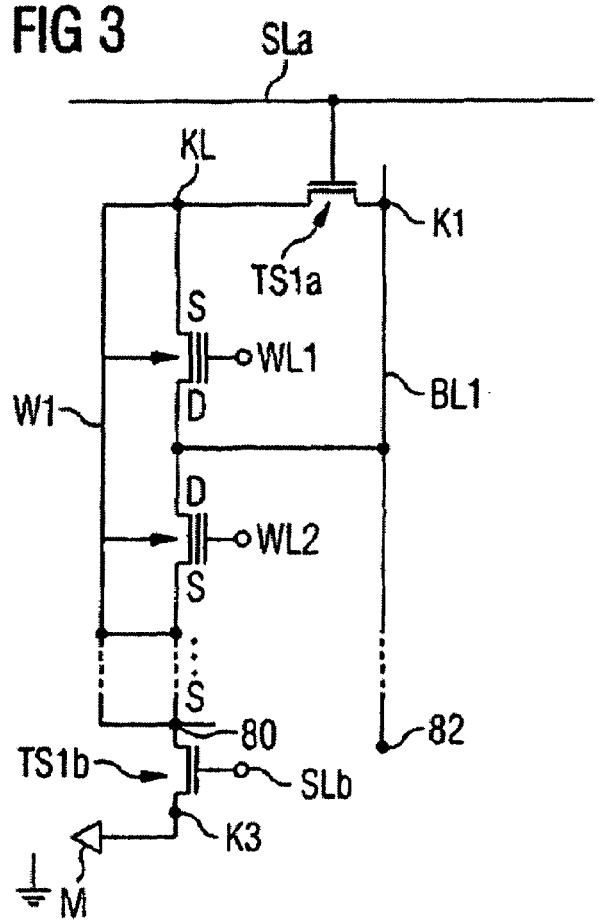
FIG. 3 illustrates a circuit diagram of a column of the memory cell array.

FIG. 3 shows a circuit diagram of the first column of the memory segment 60. The other columns of the memory segment 60 are constructed like the first column and are therefore not explained in any further detail. In addition to the elements already explained with reference to FIG. 2, the first column of the memory segment 60 contains two configuration transistors TS1a and TS1b. The operating path of the configuration transistor TS1a lies between the well W1 and the local bit line BL1, that is to say source at the well W1 and drain at the local bit line BL1. The control electrode of the configuration transistor TS1a is connected to a control line SLa, which is also connected to the control electrodes of the configuration transistors TS2a, TS3a, etc. of the other columns of the memory segment 60.

The configuration transistor TS1b lies at the lower end of the first column. Its operating path lies between the well W1 and a ground line M carrying a ground reference or a potential of 0 Volts. The control electrode of the configuration transistor TS1b is connected to a control line SLb, to which the control electrodes of the other lower configuration transistors TS2b, TS3b etc. of the memory segment 60 are also connected.

In another exemplary embodiment, the configuration transistor TS1a lies between two circuit points 80, 82 at the lower end of the well W1 and at the lower end of the local bit line BL1. In a further exemplary embodiment, the configuration transistor TS1a lies between the eighth and ninth memory cells of the first column of the memory segment 60.

In addition to the configuration transistors TS1a and TS1b, for the first column of the memory segment 60 there is also a selection transistor (not illustrated) for connecting the local bit line BL1 to the global drain line GDL1. However, this selection transistor is not illustrated in FIG. 3.

During the operation of the circuit arrangement 50, the configuration transistors TS1a and TS1b are alternately driven. That is the configuration transistors TS1a and TS1b are driven so that in each case one configuration transistor turns off and the other configuration transistor turns on. If the configuration transistor TS1a turns on, then the bit line BL1 is connected to the well W1. The well W1 and thus also the source line of the first column carry the potential of the bit line BL1. If the transistor TS1a turns on, then the transistor TS1b isolates the well W1 and the source line from the ground line M. If, by contrast, the configuration transistor TS1b turns on, then the ground potential is applied to the well W1 and the source line. If the configuration transistor TS1b turns on, the configuration transistor TS1a is turned off, so that no potential conflict occurs between the potential of the well W1 and the potential on the bit line BL1.

The configuration transistor TS1a is in the on state in the case of writing to a memory cell of the first column of the memory segment 60 or to some other memory cell of the memory segment 60. The transistor TS1a is additionally in the on state if a memory cell in the memory segment 60 that is not arranged in the first column is being read.

The configuration transistor TS1b is in the on state if a memory cell of the first column of the memory segment 60 is being read. The configuration transistor TS1a is in the on state in the case of erasure.

FIG. 4 shows the layout of part of the circuit arrangement 50. The meaning of the reference symbols has already been explained above with reference to FIGS. 1 to 3. Trenches G0 to Gm were introduced into a substrate and filled with an insulating material, such as silicon dioxide. The insulating wells W1, W2, etc. were produced between the trenches G0, G1, G2, etc. or before the production of the trenches G0, G1, G2, etc. By way of example, an n-doped layer was introduced in a lightly p-doped substrate and a p-doped layer was introduced above that. FIG. 4 does not illustrate the wells W1, W2, etc. since they are covered by the active areas of the transistors which are situated at the substrate surface.

The memory transistors T11 to T22 or Tmn of the memory cell array have a layout such as has also been used hitherto. Therefore, this layout is not illustrated completely in FIG. 4, but rather is only indicated by two break lines 100.

In the first metallization layer, the local bit lines BL1, BL2, etc. run in the vertical direction over the cell array. These bit lines end at the drain contact of the transistor T1n, T2n, etc., that is to say at the drain contact of the last transistor of a column. Also situated in the first metallization plane is the ground line M, which runs in the horizontal direction in FIG. 4, that is to say at right angles to the local bit lines BL1, BL2, etc.

The local bit lines BL1, BL2, etc. are connected via contacts K1 to the drain regions of the configuration transistors TS1a, TS1b, etc. Moreover, the bit lines BL1, BL2 are connected to the drain regions of the memory transistors of the memory cell array. The ground line M is connected via contacts K3 to the source region of the configuration transistor TS1b, TS2b, etc.

In the second metallization plane, the global drain or bit lines GDL1, GDL2, etc. run in the vertical direction. As already mentioned, the global drain lines GDL1, GDL2 are connected to the respective local bit line BL1, BL2, etc. via selection transistors that are not illustrated.

Proceeding from the active source regions of the memory transistors T11 to Tmn, there are in each case contact-connections to the wells W0, W1, etc.; see for example the contact-connection K2 of the memory transistor T11 and the contact-connection 80 of the memory transistor T1n in the first column. The contact-connections K2 and 80 are also depicted in FIG. 3.

The potentials when programming the memory transistor T11 are specified below:
  −3 Volts on the bit line BL1,
  +3 Volts on the bit line BL2,
  +2.5 Volts on the control line SLa,
  +14 Volts on the selected word line (here WL1),
  0 or −3 Volts on the nonselected word lines (not illustrated),
  −3 Volts on the control line SLb, and thus
  −3 Volts at the well W0 and +3 Volts at the well W1.

Consequently, what is achieved by using the configuration transistors is that adjacent wells W0 and W1 are at different potentials. Additional vertical lines for the application of the potentials in addition to the local bit lines BL1, BL2 are not necessary, with the result that only a small chip area is required for the circuit arrangement 50.

The following potentials are applied when reading T11:
  +1 volt on the local bit line BL1,
  0 Volts on the local bit line BL2,
  0 Volts on the control line SLa,
  +2.5 Volts on the word line WL1,
  0 Volts on the nonselected word lines (not illustrated),
  +2.5 Volts on the control line SLb, and thus
  0 Volts in each case at the wells W0 and W1.

The use of the configuration transistors makes it possible, in the read operating mode, to connect the well W1 and the bit line BL1 to different potentials, and the well W2 and the bit line BL2 to identical potentials. This is possible even though the configuration transistors TS1a, TS2a, etc. are driven via a common control line SLa and the configuration transistors TS1b, TS2b, etc. are driven via a common control line SLb.

In another exemplary embodiment, a local bit line BL1 is optionally contact-connected to the underlying well via at least two configuration transistors TS1a. In addition or as an alternative, there are multiple ground lines M for each sector, so that each well can be contact-connected with the aid of at least two configuration transistors TS1b. By virtue of this measure, a fast read access is possible and only comparatively small voltage drops arise along the wells and hence the source lines.

The circuit arrangement explained makes it possible to obtain the smallest possible offset between adjacent bit lines BL1, BL2. Only a single metallic bit line may be provided per column.

In an alternative exemplary embodiment, adjacent bit lines are not brought as close as the minimum possible offset, because the metallic bit lines are made wider or because the capacitances between adjacent bit lines are intended to be reduced on account of an increase in the distance between these bit lines. Improved electronic properties of the memory circuit thus result instead of an area saving. A compromise between reducing the chip area and improving the electrical properties is also obtained in another exemplary embodiment. By reducing the number of metal lines, moreover, the susceptibility to defects is reduced in production and so a higher yield is achieved in the production of the circuit arrangement 50.

However, the invention is not restricted to the memory circuit arrangement explained. Thus, by way of example, the concept can be modified through the use of configuration transistors such that programming is still effected using the CHE principle (Channel Hot Electrons) and erasure is effected by means of a tunneling current. However, a tunneling current that is distributed uniformly over the tunnel oxide between floating gate and substrate is used for erasure, thus resulting in less damage to the tunnel oxide than is the case with the previously used tunneling current in only a partial region of the tunnel oxide. Further applications of the concept according to the invention relate in particular to reducing the power consumption of the memory circuit.

In particular, the invention can also be used when only bit lines in doped regions are used, or when bit lines are routed in isolation trenches.

We claim:

1. An integrated memory circuit arrangement comprising:
  a plurality of memory cells arranged in a matrix where the memory cells are arranged in rows and columns, each memory cell including at least one transistor;
  word lines coupled to control electrodes of the transistors of memory cells of a row of the matrix;
  bit lines coupled to electrodes of the transistors of memory cells of a column of the matrix;

a single switching element per column, the single switching element configured to connect two local bit lines of a common column without the need of any additional switching elements;

a collective line in the row direction of the matrix where at least one further switching element per column enables the production and disconnection of an electrically conductive connection of the collective line to a respective bit line, the collective line having the same potential in all of the operating modes;

a first bit line of the two local bit lines being electrically conductively connected to the single switching element, the first bit line being formed from a doped region of a semiconductor substrate; and a second bit line of the two local bit lines being electrically conductively connected to the single switching element, the second bit line of the two local bit lines comprising a metallic line.

2. The circuit arrangement of claim 1, where the circuit arrangement includes at least two memory segments each defined by local bit lines configured to be electrically conductively connected to global bit lines via switching elements.

3. The circuit arrangement of claim 2, where the number of global bit lines is half the number of metallic local bit lines.

4. The circuit arrangement of claim 2, where the single switching element is arranged at an end of the memory cells of a column of a memory segment.

5. The circuit arrangement of claim 2, where the single switching element is arranged between the memory cells of a column of a memory segment.

6. The circuit arrangement of claim 5, where the single switching element is arranged between the memory cells of a column of a memory segment towards the center of a column.

7. An integrated memory circuit arrangement, comprising:

a plurality of memory cells arranged in matrix-type fashion, the memory cells each containing at least one transistor;

word lines at the control electrodes of the transistors of memory cells of a row of the matrix;

bit lines at terminal electrodes of the transistors of memory cells of a column of the matrix;

a collective line in the row direction of the matrix, a single switching element per column, the the single switching element configured to connect the collective line to two local bit lines without the need of an additional switching elements, where the collective line carries the same potential in all of the operating modes; and a first bit line of the two local bit lines being electrically conductively connected to the single switching element, the first bit line being formed from a doped region of a semiconductor substrate; and a second bit line of the two local bit lines being electrically conductively connected to the single switching element, the second bit line of the two local bit lines comprising a metallic line.

8. The circuit arrangement of claim 7, comprising a control unit configured to drive switching elements connecting two bit lines alternately to at least one switching element per column enabling the production and disconnection of an electrically conductive connection of the collective line to a respective bit line.

9. The circuit arrangement of claim 8, where a second switching element connecting the two local bit lines is adjacent to the single switching element for a column of memory cells of a memory segment are adjacent to one another.

10. The circuit arrangement of claim 8, where a second switching element connecting the two bit lines and the single switching element for a column of memory cells of a memory segment are not adjacent to one another at different ends of the column.

11. The circuit arrangement of claim 8, where each memory cell includes a single floating gate transistor, and a drive circuit is configured to program and erase the floating gate transistor which is programmed with a uniform channel using a tunneling current, and where a second switching element connecting two bit lines and the single switching element for a column of memory cells of a memory segment are field effect transistors, the second switching elements connecting two bit lines being electrically conductively connected to a first common control line, single switching element for a column of memory cells of a memory segment control elements for connecting the collective line to the bit lines being electrically conductively connected to a second common control line, where the second switching element connecting two bit lines and the single switching element for a column of memory cells of a memory segment switching elements do not have a data storage function.

12. The circuit arrangement of claim 8, where each memory cell includes a single floating gate transistor, and a drive circuit is configured to program and erase the floating gate transistor is programmed with a uniform channel using a tunneling current, a the second switching element connecting two bit lines being electrically conductively connected to a first common control line, the single switching element for a column of memory cells of a memory segment control elements for connecting the collective line to the bit lines being electrically conductively connected to a second common control line, where the second switching element connecting two bit lines and the single switching element for a column of memory cells of a memory segment switching elements do not have a data storage function.

13. An electronic memory arrangement having memory cells arranged in rows and columns, the row being defined by word lines and the columns being defined by bit lines, the electronic memory arrangement comprising;

a single bit line switching means for switching an electrical connection between two local bit lines of a column of the memory arrangement;

reference switching means for switching at least one bit line of a column to a reference potential, the reference potential being common for all of the operating modes of the memory circuit and;

a first bit line of the two local bit lines being electrically conductively connected to the single switching element, the first bit line being formed from a doped region of a semiconductor substrate; and a second bit line of the two local bit lines being electrically conductively connected to the single switching element, the second bit line of the two local bit lines comprising a metallic line.

14. The electronic memory arrangement of claim 13 further comprising control means for alternately switching the bit line switching means and the reference switching means.

15. The electronic memory arrangement of claim 14 where the reference potential is a ground reference.

16. A method for controlling data in an electronic memory arrangement having memory cells arranged in rows and columns, the row being defined by word lines and the columns being defined by bit lines, the method comprising:
- switching an electrical connection between two local bit lines of a column of the memory arrangement using a single switching element;
- switching at least one of the local bit lines of a column to a reference potential, the reference potential being common for all of the operating modes of the memory circuit and;
- wherein a first bit line of the two local bit lines electrically conductively connected to the single switching element, the first bit line being formed from a doped region of a semiconductor substrate; and a second bit line of the two local bit lines electrically conductively connected to the single switching element, the second bit line of the two local bit lines comprising a metallic line.

17. The method of claim 16 further comprising alternately switching the connection between the two bit lines and the switching at least one bit line of a column to a reference potential.

18. The method of claim 17 where the reference potential is a ground reference.

* * * * *

UNITED STATES PATENT AND TRADEMARK OFFICE
CERTIFICATE OF CORRECTION

PATENT NO. : 7,349,251 B2  Page 1 of 1
APPLICATION NO. : 11/283251
DATED : March 25, 2008
INVENTOR(S) : Georg Tempel It is certified that error appears in the above-identified patent and that said Letters Patent is hereby corrected as shown below:

Column 9, in claim 7, line 11, after "element per column," delete "the" (second occurrence).

Column 10, in claim 12, line 5, after "current, a" delete "the".

Column 10, in claim 13, line 4, immediately after "arrangement comprising" delete ";" (semicolon) and substitute --:-- (colon) in its place.

Columns 10-11, in claim 16, line 11, delete "circuit and;" and substitute --circuit; and-- in its place.

Signed and Sealed this

Twenty-second Day of July, 2008

JON W. DUDAS
*Director of the United States Patent and Trademark Office*